(12) United States Patent
Chen et al.

(10) Patent No.: US 12,426,351 B2
(45) Date of Patent: Sep. 23, 2025

(54) SEMICONDUCTOR DEVICE HAVING WIDE TUNING RANGE VARACTOR AND METHOD OF MANUFACTURING THE SAME

(71) Applicant: TAIWAN SEMICONDUCTOR MANUFACTURING COMPANY LTD., Hsinchu (TW)

(72) Inventors: Ho-Hsiang Chen, Hsinchu (TW);
Chi-Hsien Lin, Taichung (TW);
Ying-Ta Lu, Hsinchu (TW);
Hsien-Yuan Liao, Hsinchu (TW);
Hsiu-Wen Wu, Taoyuan (TW);
Chiao-Han Lee, Taichung (TW);
Tzu-Jin Yeh, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 217 days.

(21) Appl. No.: 17/747,033

(22) Filed: May 18, 2022

(65) Prior Publication Data

US 2023/0378169 A1 Nov. 23, 2023

(51) Int. Cl.
*H01L 27/02* (2006.01)
*H10D 1/64* (2025.01)
*H10D 84/00* (2025.01)

(52) U.S. Cl.
CPC ............ *H10D 84/215* (2025.01); *H10D 1/64* (2025.01)

(58) Field of Classification Search
CPC . H01L 27/0808; H01L 29/93; H01L 27/0207; H01L 29/94; H01L 27/0811; H01L 27/0629; H01L 27/02; H01L 27/08; H10D 84/00; H10D 84/215; H10D 1/64; H10D 89/10
See application file for complete search history.

(56) References Cited

U.S. PATENT DOCUMENTS

| | | | |
|---|---|---|---|
| 6,943,399 B1* | 9/2005 | Gau | H01L 29/423 257/598 |
| 9,299,699 B2* | 3/2016 | Lin | H01L 27/0924 |
| 11,264,517 B2* | 3/2022 | El-Tanani | H01L 29/0657 |
| 2012/0187494 A1* | 7/2012 | Huang | H01L 29/94 257/E27.06 |
| 2020/0105747 A1* | 4/2020 | Lee | H01L 29/94 |

* cited by examiner

*Primary Examiner* — Chuong A Luu
(74) *Attorney, Agent, or Firm* — Hauptman Ham, LLP

(57) ABSTRACT

The present disclosure provides a semiconductor device and a method of manufacturing a semiconductor device. The semiconductor device comprises a substrate, a first gate electrode, a second gate electrode, a first doped region, a second doped region, a third doped region, and a first interconnection structure. The substrate comprises a well region of a first conductive type. The first and second gate electrodes are disposed on the substrate. The first, second, and third doped regions are embedded within the well region and are of the first conductive type. The first interconnection structure electrically connects the first gate electrode and the second gate electrode. The first doped region and the second doped region are disposed on opposite sides of the first gate electrode.

20 Claims, 15 Drawing Sheets

| C@5GHz | L1/No Stack | L1/Stack2 | L1/Stack3 | L1/Stack4 |
|---|---|---|---|---|
| Cmin | 13.5 | 8.2 | 6.9 | 6.8 |
| Cmax | 29.8 | 29.3 | 29.8 | 30.6 |
| CV tuning ratio | 2.2 | 3.6 | 4.3 | 4.5 |

| C@10GHz | L1/No Stack | L1/Stack2 | L1/Stack3 | L1/Stack4 |
|---|---|---|---|---|
| Cmin | 13.5 | 8.1 | 6.8 | 6.7 |
| Cmax | 29.8 | 29.2 | 29.6 | 30.3 |
| CV tuning ratio | 2.2 | 3.6 | 4.4 | 4.5 |

| C@10GHz | L1/No Stack | L1/Stack2 | L1/Stack3 | L1/Stack4 | L2/No Stack |
|---|---|---|---|---|---|
| Cmin | 13.5 | 8.1 | 6.8 | 6.7 | 6.5 |
| Cmax | 29.8 | 29.2 | 29.6 | 30.3 | 25.7 |
| CV tuning ratio | 2.2 | 3.6 | 4.4 | 4.5 | 3.9 |

SEMICONDUCTOR DEVICE HAVING WIDE TUNING RANGE VARACTOR AND METHOD OF MANUFACTURING THE SAME

BACKGROUND

The present invention relates generally to semiconductor devices, and more particularly to semiconductor devices having wide tuning range varactors utilizing single gate length technology.

In advanced semiconductor architecture, while dies of different gate lengths are used, double patterning technology limits the choice of FinFET or Nanosheet gate lengths. A wide C-V curve tuning varactor is preferred to mitigate the shortcomings of single gate length offering.

In RF oscillator designs, frequency is determined by inductors and capacitors of RF oscillator. The inductors, located the top-thick metal layers, are always difficult to tune. The capacitors are more easy and suitable for frequency tuning. MOSFETs operated in accumulation mode may be used for frequency tuning similar to varactors. The C-V curve behavior of varactors plays a key role in the frequency tuning.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimension of the various structures may be arbitrarily increased or reduced for clarity of discussion.

DETAILED DESCRIPTION

Figure 1A:
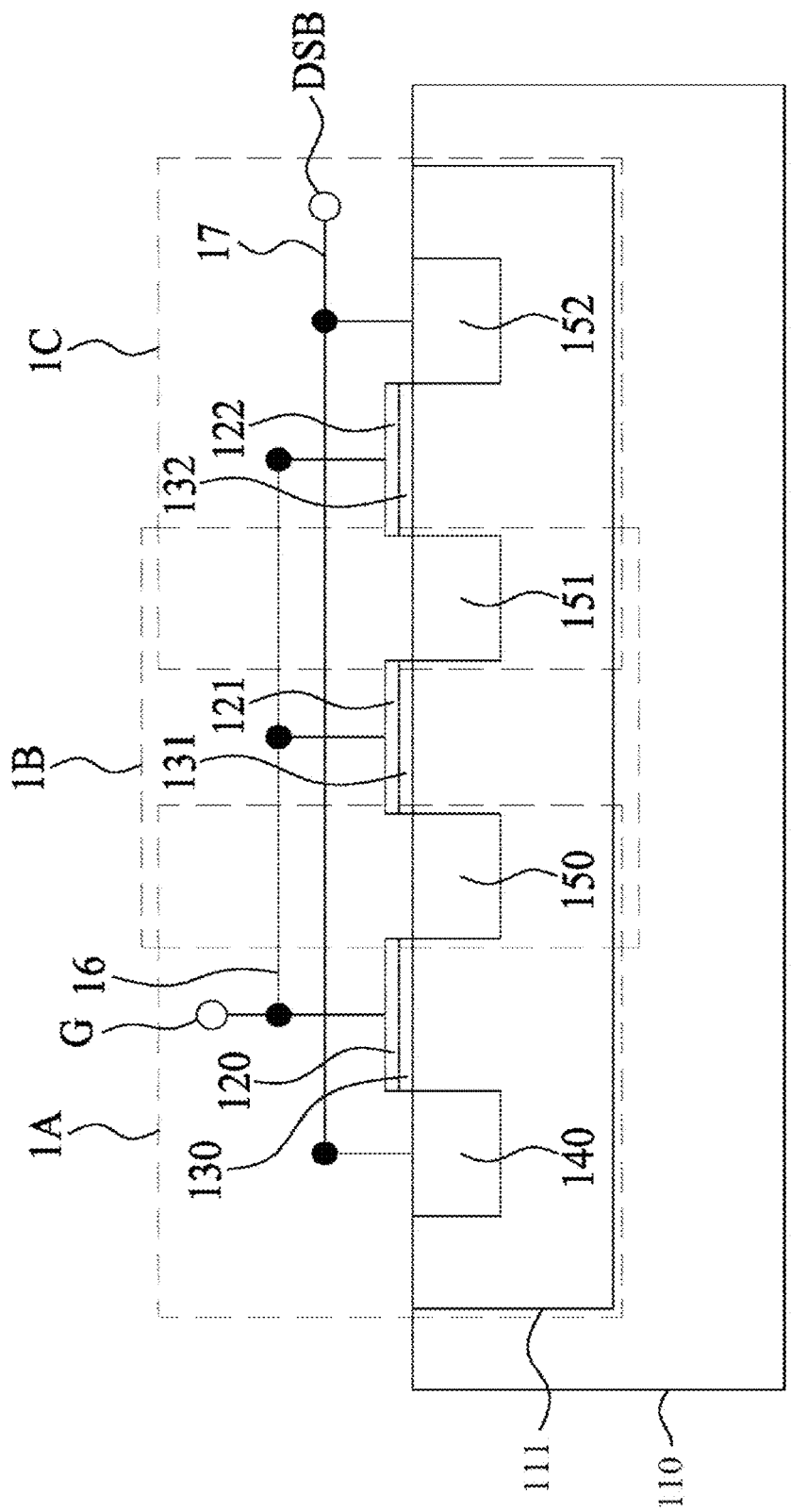
FIG. 1A illustrates an exemplary cross-section view of a semiconductor structure utilizing stacked MOS varactors, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Double patterning technique can limit the choices of gate lengths, since use of too many gate lengths can impede completion of CMP process in manufacturing. To enable completion of the CMP process, additional measures are required, and thus more spaces are needed for the manufacture. Fewer gate length choices (e.g., single gate length) are preferred. However, if multiple gate lengths are needed, stacking devices of a single gate length are preferable to devices of increased gate length.

FIG. 1A illustrates an exemplary cross-section view of a semiconductor structure 1 utilizing stacked MOS varactors 1A, 1B, and 1C, in accordance with some embodiments of the present disclosure. Since the varactor is built natively from MOSFET, the stacked structure of MOSFETs may effectively increase the gate length of the MOSFETs. The stacked varactor may have the same AC performance as that with an increased gate length. As shown in FIG. 1A, the stacked MOS varactor structure 1 includes three stacks of MOS varactors 1A, 1B, and 1C.

A substrate 110 is provided. The substrate 110 is of a first conductive type. The substrate 110 includes a well region 111. The well region 111 is of the first conductive type. A gate electrode 120 is disposed on the substrate 110. A gate insulating film 130 is disposed on the substrate 110. The gate insulating film 130 is disposed between the gate electrode 120 and the substrate 110. A doped region 140 is embedded within the well region 111. The doped region 140 is of the first conductive type. The doped region 140 and the well region 111 are substantially equal in electrical potential.

Another doped region 150 is embedded within the well region 111. The doped region 150 is of the first conductive type. The doped region 140 and the doped region 150 are disposed on opposite sides of the gate electrode 120. The MOS varactor 1A includes the substrate 110 including the well region 111, the gate electrode 120, the gate insulating film 130, and the doped regions 140 and 150.

As shown in FIG. 1A, a gate electrode 121 is disposed on the substrate 110. A gate insulating film 131 is disposed on the substrate 110. The gate insulating film 131 is disposed between the gate electrode 121 and the substrate 110. A doped region 151 is embedded within the well region 111. The doped region 151 is of the first conductive type. The doped region 150 and 151 are disposed on opposite sides of the gate electrode 121. A MOS varactor 1B includes the substrate 110 including the well region 111, the gate electrode 121, the gate insulating film 131, and the doped regions 150 and 151. An interconnection structure 16 electrically connects the gate electrodes 120 and 121.

Still referring to FIG. 1A, a gate electrode 122 is disposed on the substrate 110. A gate insulating film 132 is disposed on the substrate 110. The gate insulating film 132 is disposed between the gate electrode 122 and the substrate 110. A doped region 152 is embedded within the well region 111. The doped region 152 is of the first conductive type. The doped region 151 and 152 are disposed on opposite sides of the gate electrode 122. The doped region 152 and the well region 111 are substantially equal in electrical potential.

A MOS varactor 1C includes the substrate 110 including the well region 111, the gate electrode 122, the gate insulating film 132, and the doped regions 151 and 152. The interconnection structure 16 electrically connects the gate electrodes 120, 121 and 122 to a node G. An interconnection structure 17 electrically connect the doped regions 140 and 152 to a node DSB. The doped regions 150 and 151 are not electrically connected to the doped regions 140 and 152.

In some embodiments, the doped region 140 and the well region 111 are substantially equal in electrical potential. In some embodiments, the doped region 140 and the well region 111 are electrically connected. In some embodiments, the doped region 152 and the well region 111 are substantially equal in electrical potential. In some embodiments, the doped region 152 and the well region 111 are electrically connected.

In some embodiments, the substrate 110 is a semiconductor substrate that includes silicon, gallium arsenide ("GaAs") or silicon germanium ("SiGe"), or other semiconductor materials. In some embodiments, the substrate 110 is an N-type substrate. The well region 111 is N-type. The N-type semiconductor material is formed by substituting appropriate dopant atoms, such as phosphorous ("P"), in the crystal lattice. In some embodiments, the substrate 110 is a P-type substrate. The well region 111 is P-type. The P-type semiconductor material is formed by substituting appropriate dopant atoms, such as boron ("B"), in the crystal lattice. In some embodiments, the semiconductor structure 1 can be formed without the substrate 110.

Figure 1B:
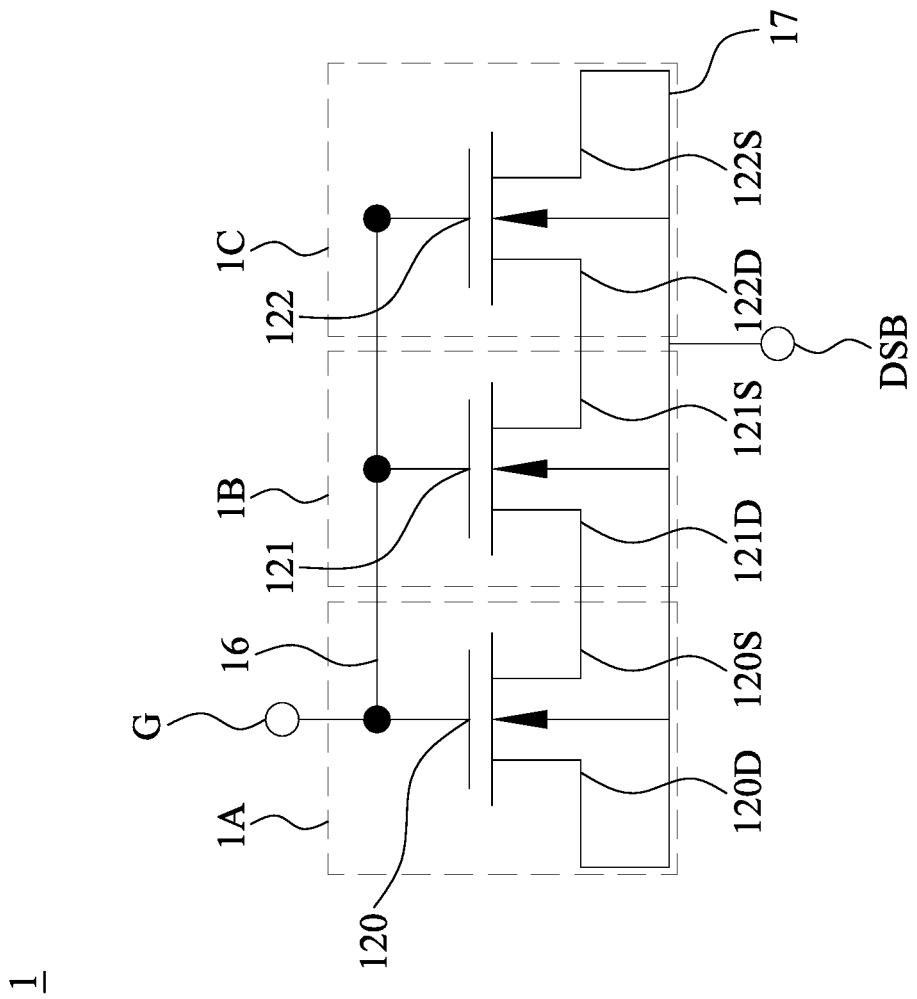
FIG. 1B illustrates an exemplary schematic circuit diagram of a semiconductor structure utilizing stacked MOS varactors, in accordance with some embodiments of the present disclosure.

FIG. 1B illustrates an exemplary schematic circuit diagram of a semiconductor structure 1 utilizing stacked MOS varactors, in accordance with some embodiments of the present disclosure. As shown in FIG. 1B, the MOS varactor 1A includes a gate electrode 120, a drain electrode 120D, and a source electrode 120S.

As shown in FIG. 1B, the MOS varactor 1B includes a gate electrode 121, a drain electrode 121D, and a source electrode 121S. The source electrode 120S of the MOS varactor 1A and the drain electrode 121D of the MOS varactor 1B are electrically connected by sharing the doped region 150 as shown in FIG. 1A.

As shown in FIG. 1B, the MOS varactor 1C includes a gate electrode 122, a drain electrode 122D, and a source electrode 122S. The source electrode 121S of the MOS varactor 1B and the drain electrode 122D of the MOS varactor 1C are electrically connected by sharing the doped region 151 as shown in FIG. 1A.

As shown in FIG. 1B, the gate electrodes 120, 121, and 122 are electrically connected to a node G by an interconnection structure 16. The drain electrode 120D of the MOS varactor 1A and the source electrode 122S of the MOS varactor 1C are electrically connected to a node DSB by an interconnection structure 17. The bulks of the MOS varactors 1A, 1B and 1C are electrically connected to the node DSB by the interconnection structure 17.

Figure 1C:
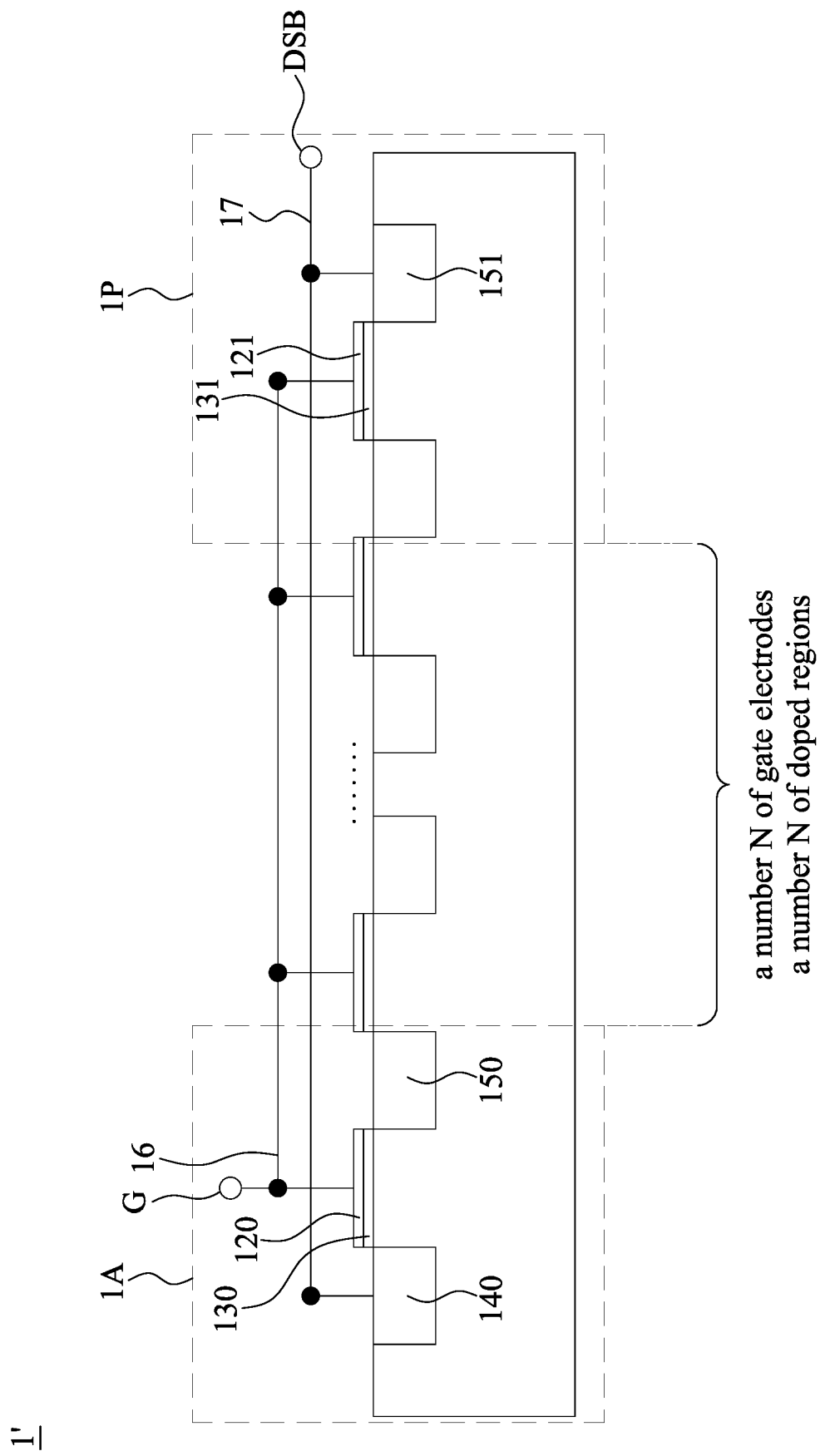
FIG. 1C illustrates an exemplary schematic view of a semiconductor structure utilizing stacked MOS varactors, in accordance with some embodiments of the present disclosure.

FIG. 1C illustrates an exemplary schematic view of a semiconductor structure 1' utilizing stacked MOS varactors, in accordance with some embodiments of the present disclosure. In some embodiments, the stacked MOS varactor structure 1' differs from the stacked MOS varactor structure 1 of FIG. 1A only in its inclusion of a number N of semiconductor structures disposed between the MOS varactor 1A and the MOS varactor 1P.

The number N of semiconductor structures includes a number N of gate electrodes disposed between the gate electrode 120 and the gate electrode 121, and a number N of doped regions disposed between the gate electrode 120 and the gate electrode 121. The interconnection structure 16 electrically connects the gate electrode 120, the gate electrode 121, and the number N of gate electrodes. The interconnection structure 17 electrically connects the doped region 140 and the doped region 151. The number N of semiconductor structures further includes doped regions disposed between the doped region 140 and the doped region 151. The number N of doped regions can function as the drain electrode of a MOS varactor and the source electrode of the next MOS varactor simultaneously. In some embodiments, the number N is a positive integer equaling or exceeding one.

Figure 1D:
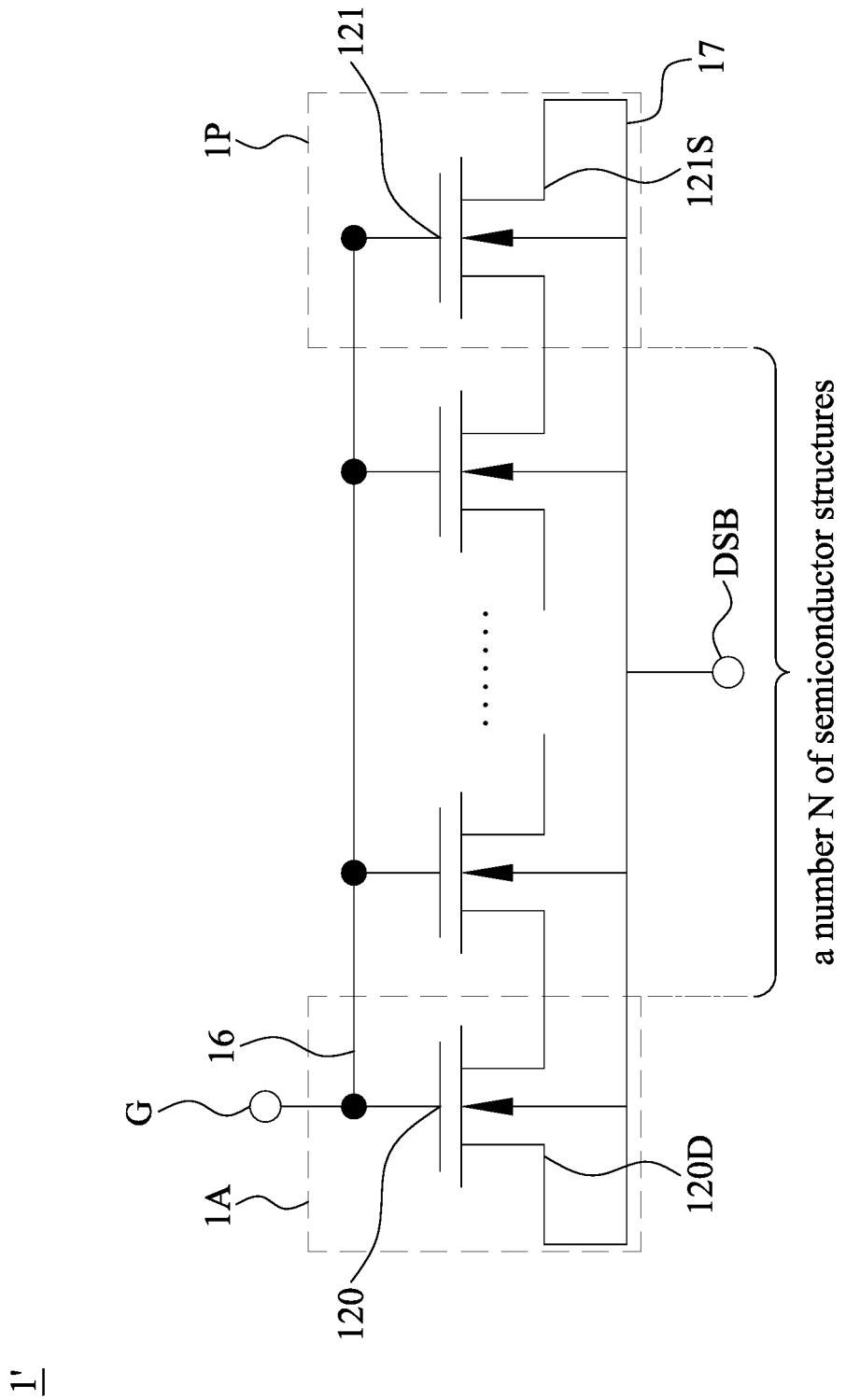
FIG. 1D illustrates an exemplary schematic circuit diagram of a semiconductor structure utilizing stacked MOS varactors, in accordance with some embodiments of the present disclosure.

FIG. 1D illustrates an exemplary schematic circuit diagram of a semiconductor structure 1' utilizing stacked MOS varactors, in accordance with some embodiments of the present disclosure. In some embodiments, the stacked MOS varactor structure 1' differs from the stacked MOS varactor structure 1 in FIG. 1A only in its inclusion of a number N of semiconductor structures disposed between the MOS varactor 1A and the semiconductor structure 1P.

The number N of semiconductor structures includes a number N of gate electrodes disposed between the gate electrode 120 and the gate electrode 121 and a number N of doped regions disposed between the gate electrode 120 and the gate electrode 121. The interconnection structure 16 electrically connects the gate electrode 120, the gate electrode 121, and the number N of gate electrodes. The interconnection structure 17 electrically connects the drain electrode 120D and the source electrode 121S. The number N of semiconductor structures further includes gate electrodes and source electrodes disposed between the drain electrode 120D and the source electrode 121S.

As shown in FIG. 1D, the gate electrodes 120, 121, and the number N of gate electrodes are electrically connected to a node G by an interconnection structure 16. The drain electrode 120D and the source electrode 121S are electrically connected to a node DSB by an interconnection structure 17. The bulk of the MOS varactor 1A, the bulk of the number N of semiconductor structures, and the bulk of the semiconductor structure 1P are electrically connected to the node DSB by the interconnection structure 17.

Figure 2:
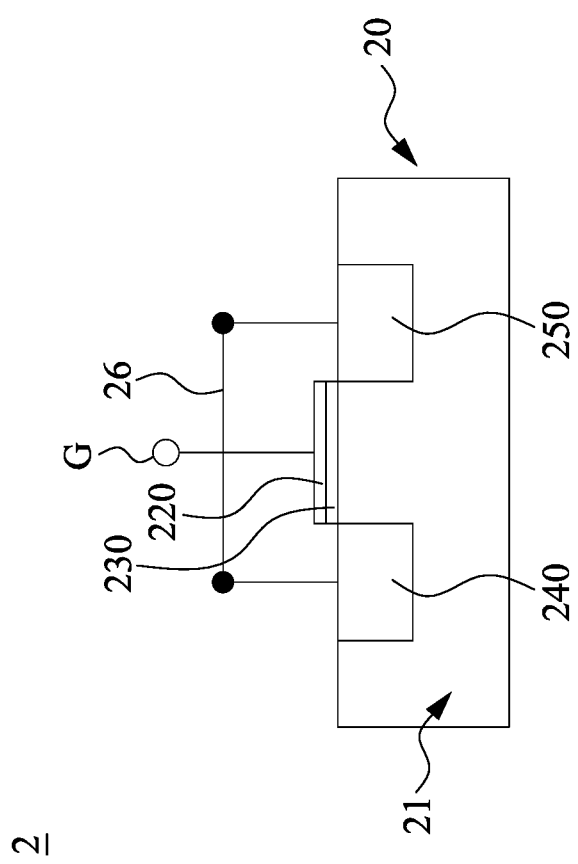
FIG. 2 illustrates an exemplary cross-section view of a MOS varactor.

FIG. 2 illustrates an exemplary cross-section view of a MOS varactor 2. A substrate 20 is provided. The substrate 20 is of the first conductive type. The substrate 20 includes a well region 21. The well region 21 is of the first conductive type. A gate electrode 220 is disposed on the substrate 20. A gate insulating film 230 is disposed on the substrate 20. The gate insulating film 230 is disposed between the gate electrode 220 and the substrate 20. A doped region 240 is embedded within the well region 21. The doped region 240 is of the first conductive type. The doped region 240 and the well region 21 are substantially equal in electrical potential.

Another doped region 250 is embedded within the well region 21. The doped region 250 is of the first conductive type. The doped region 240 and the doped region 250 are disposed on opposite sides of the gate electrode 220. The MOS varactor 2 includes the substrate 20 including the well region 21, the gate electrode 220, the gate insulating film 230, and the doped regions 240 and 250.

Figures 3A, 3B:
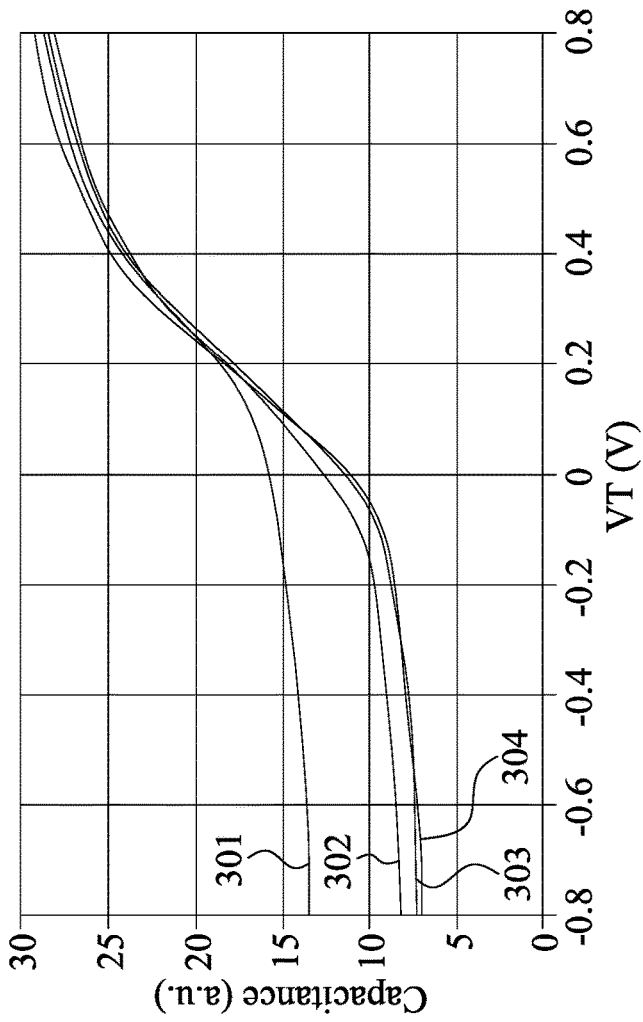
FIG. 3A illustrates exemplary C-V curves of MOS varactor structures of different stacks, in accordance with some embodiments of the present disclosure.
FIG. 3B illustrates a table showing the capacitances of MOS varactor structures of different stacks, in accordance with some embodiments of the present disclosure.

FIG. 3A illustrates exemplary C-V curves of MOS varactor structures of different stacks, in accordance with some embodiments of the present disclosure. The MOS varactor structure used for obtaining the data shown in FIG. 3A is the same as that shown in FIG. 1D. In the configuration of FIG. 1D, the stacked varactors 1A, 1B, . . . , and 1P can be viewed as capacitors connected in series. When more MOS varactors are stacked, the equivalent capacitance decreases. The horizontal axis represents the difference between the voltage (i.e., the tuning voltage VT) of the gate electrode and that of the bulk of the stacked MOS varactor structure. The vertical axis represents capacitances of the stacked MOS varactor structures with arbitrary unit (a.u.) which is size dependent. The MOS varactor(s) is operated at a frequency of 5 GHz. Curve 301 refers to the C-V tuning curve of a MOS varactor structure of only one MOS varactor. Curve 302 refers to the C-V tuning curve of a MOS varactor structure comprising two stacked MOS varactors. Curve 303 refers to the C-V tuning curve of a MOS varactor structure comprising three stacked MOS varactors. Curve 304 refers to the C-V tuning curve of a MOS varactor structure comprising fourth stacked MOS varactors. FIG. 3A shows four curves with an identical gate length L1, while the number of stacked MOS varactors ranges from zero to four. In some embodiments, the gate length L1 can ranges from 1 nm to 10 nm.

As can be seen from FIG. 3A, when the tuning voltage VT is greater than zero, the capacitance of the MOS varactor barely changes even if the number of stacks increases. However, when the tuning voltage VT is less than zero, the capacitance of the MOS varactor is becoming smaller if the number of stacks increases. If the MOS varactor has a smaller capacitance, it can be operated at a higher frequency, which is beneficial to advanced technology. Therefore, the proposed stacked MOS varactor structure can be beneficial for a semiconductor device designed to be operated at a higher frequency.

FIG. 3B illustrates a table showing the measured capacitances of Nanosheet MOS varactor structures of different stacks, in accordance with some embodiments of the present disclosure. The MOS varactor(s) is operated at a frequency of 5 GHz. From FIG. 3B, the maximum capacitance of the MOS varactor having four stacks is larger than that of the MOS varactor having less than four stacks. The minimum capacitance of the MOS varactor having four stacks is smaller than that of the MOS varactor having less than four stacks. The C-V tuning ratio refers to the maximum capacitance divided by the minimum capacitance. A greater C-V tuning ratio usually means a greater application of a MOS varactor.

Figures 4A, 4B:
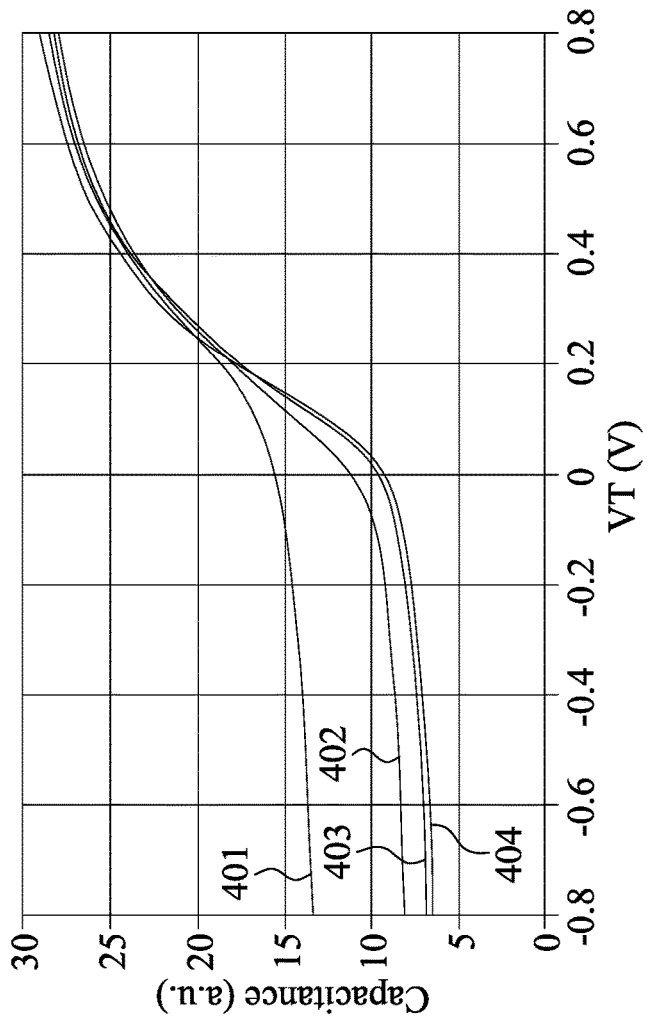
FIG. 4A illustrates exemplary C-V curves of MOS varactor structures of different stacks, in accordance with some embodiments of the present disclosure.
FIG. 4B illustrates a table showing the capacitances of MOS varactor structures of different stacks, in accordance with some embodiments of the present disclosure.

FIG. 4A illustrates exemplary C-V curves of MOS varactor structures of different stacks, in accordance with some embodiments of the present disclosure. The MOS varactor structure used for obtaining the data shown in FIG. 4A is the same as that shown in FIG. 1D. The horizontal axis represents the difference between the voltage (i.e., the tuning voltage VT) of the gate electrode and that of the bulk of the stacked MOS varactor structure. The vertical axis represents capacitances of the stacked MOS varactor structures with arbitrary unit (a.u.). Curve 401 refers to the C-V tuning curve of a MOS varactor structure of only one MOS varactor. Curve 402 refers to the C-V tuning curve of a MOS varactor structure comprising two stacked MOS varactors. Curve 403 refers to the C-V tuning curve of a MOS varactor structure comprising three stacked MOS varactors. Curve 404 refers to the C-V tuning curve of a MOS varactor structure comprising fourth stacked MOS varactors. FIG. 4A shows four curves with an identical gate length L1, while the number of stacked MOS varactors ranges from zero to four. In some embodiments, the gate length L1 can ranges from 1 nm to 10 nm.

The MOS varactor(s) is operated at a frequency of 10 GHz. As can be seen from FIG. 4A, when the tuning voltage VT is greater than zero, the capacitance of the MOS varactor barely changes even if the number of stacks increases. However, when the tuning voltage VT is less than zero, the capacitance of the MOS varactor is becoming smaller if the number of stacks increases. If the MOS varactor has a smaller capacitance, it can be operated at a higher frequency, which is beneficial to advanced technology. Therefore, the proposed stacked MOS varactor structure can be beneficial for a semiconductor device designed to be operated at a higher frequency.

FIG. 4B illustrates a table showing the measured capacitances of Nanosheet MOS varactor structures of different stacks, in accordance with some embodiments of the present disclosure. The MOS varactor(s) is operated at a frequency of 10 GHz. From FIG. 4B, the maximum capacitance of the MOS varactor having four stacks is larger than that of the MOS varactor having less than four stacks. The minimum capacitance of the MOS varactor having four stacks is smaller than that of the MOS varactor having less than four stacks. The C-V tuning ratio refers to the maximum capacitance divided by the minimum capacitance. As shown in FIG. 4B, when a stacked MOS varactor structure includes more stacked MOSFETs, its C-V tuning ratio increases. A greater C-V tuning ratio usually means a greater application of a MOS varactor.

Figures 5A, 5B:
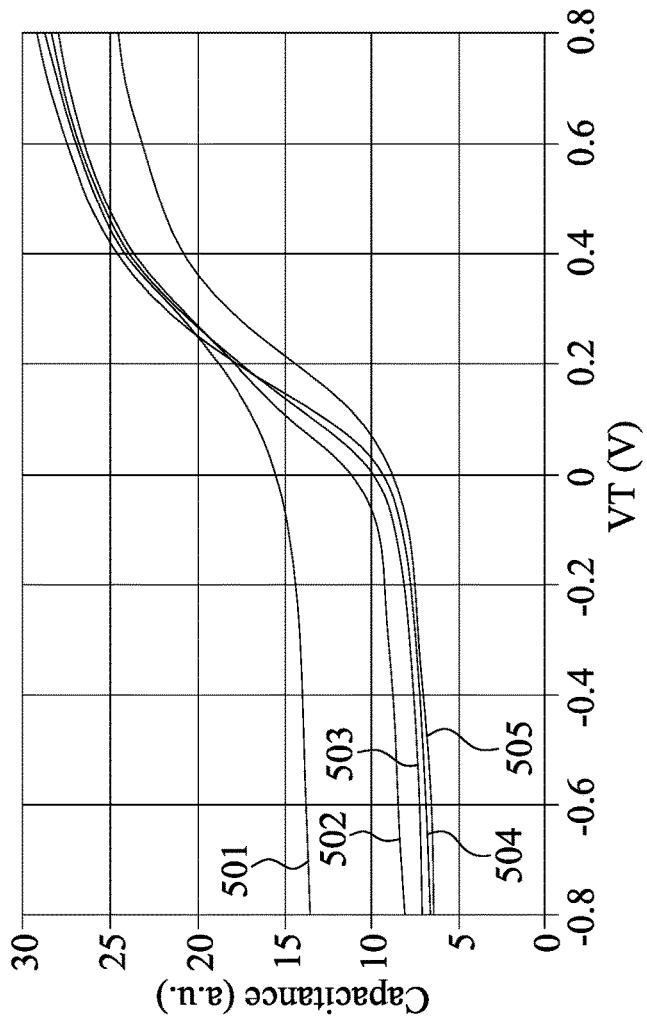
FIG. 5A illustrates exemplary C-V curves of MOS varactor structures of different stacks and gate lengths, in accordance with some embodiments of the present disclosure.
FIG. 5B illustrates a table showing the capacitances of MOS varactor structures of different stacks and gate lengths, in accordance with some embodiments of the present disclosure.

FIG. 5A illustrates exemplary C-V curves of MOS varactor structures of different stacks and gate lengths, in accordance with some embodiments of the present disclosure. The MOS varactor structure used for obtaining the data shown in FIG. 5A is the same as that shown in FIG. 1D. The horizontal axis represents the difference between the voltage (i.e., the tuning voltage VT) of the gate electrode and that of the bulk of the stacked MOS varactor structure. The vertical axis represents capacitances of the stacked MOS varactor structures with arbitrary unit (a.u.). FIG. 5A shows four curves with an identical gate length L1 while the number of stacked MOS varactors ranges from zero to four. FIG. 5A also shows one curve with gate length L2. Curve 501 refers to the C-V tuning curve of a MOS varactor structure of only one MOS varactor with the gate length of L1. Curve 502 refers to the C-V tuning curve of a MOS varactor structure comprising two stacked MOS varactors with the gate length of L1. Curve 503 refers to the C-V tuning curve of a MOS varactor structure comprising three stacked MOS varactors with the gate length of L1. Curve 504 refers to the C-V tuning curve of a MOS varactor structure comprising fourth stacked MOS varactors with the gate length of L1. Curve 505 refers to the C-V tuning curve of a MOS varactor structure of only one MOS varactor with the gate length of L2. The gate length L2 is greater than the gate length L1. In some embodiments, the gate length L1 can ranges from 3 nm to 10 nm. In some embodiments, the gate length L2 can ranges from 10 nm to 80 nm.

The MOS varactor(s) is operated at a frequency of 10 GHz. As can be seen from FIG. 5A, when the tuning voltage VT is greater than zero, the capacitance of the MOS varactor barely changes even if the number of stacks increases. However, when the tuning voltage VT is less than zero, the capacitance of the MOS varactor is becoming smaller if the number of stacks increases. If the MOS varactor has a smaller capacitance, it can be operated at a higher frequency, which is beneficial to advanced technology. Therefore, the proposed stacked MOS varactor structure can be beneficial for a semiconductor device designed to be operated at a higher frequency. If a standalone MOS varactor has a gate length L2 larger than L1, the capacitance of the MOS varactor having the larger gate length L2 is smaller than that having the smaller gate length L1. If the MOS varactor has a smaller capacitance, it can be operated at a higher frequency, which is beneficial to advanced technology.

FIG. 5B illustrates a table showing the measured capacitances of Nanosheet MOS varactor structures of different stacks and gate lengths, in accordance with some embodiments of the present disclosure. The MOS varactor(s) is operated at a frequency of 10 GHz. From FIG. 5B, the maximum capacitance of the MOS varactor of the same gate length L1 having four stacks is larger than that of the MOS varactor having less than four stacks. The minimum capacitance of the MOS varactor of the same gate length L1 having four stacks is smaller than that of the MOS varactor having less than four stacks. The C-V tuning ratio refers to the maximum capacitance divided by the minimum capacitance. As shown in FIG. 5B, when a stacked MOS varactor structure of the same gate length L1 includes more stacked MOSFETs, its C-V tuning ratio increases. A greater C-V tuning ratio usually means a greater application of a MOS varactor. In some embodiments, with the gate length L1, if the desired C-V tuning ratio is larger than 3, at least two stacked MOS varactors would be needed.

Additionally, if a standalone MOS varactor has a gate length L2 larger than L1, the maximum capacitance of the MOS varactor having the larger gate length L2 is smaller than that having the smaller gate length L1. The minimum capacitance of the MOS varactor having the larger gate length L2 is smaller than that having the smaller gate length L1.

For example, the gate length L1 may be 3 nm and the gate length L2 may be 22 nm. In some embodiments, the layout area of the stacked MOS varactor structure simulated by three stacked MOS varactors each of 3 nm gate length is smaller than that of a MOSFET simulated by a MOS varactor structure of 22 nm gate length. The ratio of the layout area of a stacked MOS varactor structure simulated by three stacked MOS varactors each of 3 nm gate length to the layout area of a MOS varactor simulated by a MOS varactor structure of 22 nm gate length is around 0.94.

In some embodiments, a stacked MOS varactor structure simulated by stacked MOS varactors each of smaller gate length is more beneficial to conserve layout area. In some embodiments, the stacked MOS varactor structure simulated by stacked MOS varactors each of smaller gate length may have a higher Q factor (Quality Factor) than the MOS varactor simulated by a MOS varactor structure of increased gate length.

Figure 6:
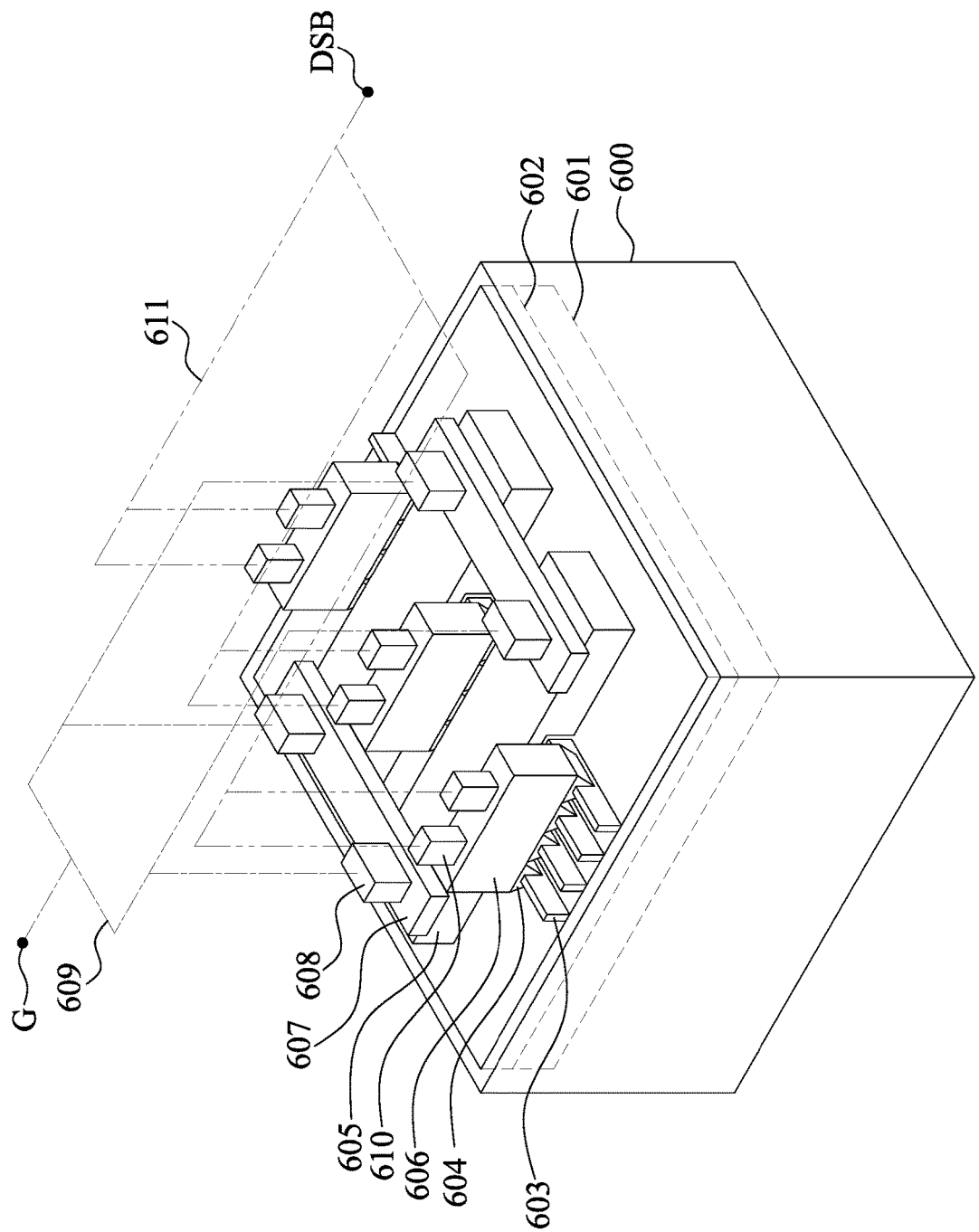
FIG. 6 illustrates an exemplary schematic view of a semiconductor device, in accordance with some embodiments of the present disclosure.

FIG. 6 illustrates an exemplary schematic view of a semiconductor device, in accordance with some embodiments of the present disclosure. The semiconductor device can be a stacked MOS varactor structure 6 with FinFET or Nanosheet architecture. A substrate 600 of a conductivity type is provided. A deep well region 601 of the conductivity type is embedded in the substrate 600. A well region 602 of the conductivity type is embedded in the deep well region 601 and the substrate 600.

A plurality of fin structures 603 are disposed on the substrate 600 and the well region 602. The plurality of fin structures 603 protrude from the well region 602. The plurality of fin structures 603 are arranged along a first orientation. The fin structures 603 and the well region 602 are substantially equal in electrical potential. An epitaxy (EPI) structure 604 is disposed on the substrate 600 and the plurality of fin structures 603. The EPI structure 604 surrounds each of the plurality of fin structures 603. Gate structures 605 are disposed on the fin structures 603. The gate structures 605 are arranged along the first orientation. Electrodes 606 are disposed on the EPI structure 604. The electrodes 606 are arranged along the first orientation. In some embodiments, the number of the electrodes 606 exceeds the number of the gate structures 605 by one.

Buffer structures 607 are disposed on the gate structures 605. The buffer structures 607 are arranged along a second orientation orthogonal to the first orientation. A plurality of terminals 608 are disposed on the buffer structures 607. The plurality of terminals 608 are electrically connected to the buffer structures 607 and the gate structures 605. In some embodiments, the number of the plurality of terminals 608 is the same as the number of the gate structures 605.

An interconnection structure 609 electrically connects the plurality of terminals 608 to a node G. The interconnection structure 609 electrically connects the gate structures 605 to the node G through the plurality of terminals 608. A plurality of terminals 610 are disposed on the electrodes 606. The plurality of terminals 610 are electrically connected to the electrodes 606. An interconnection structure 611 electrically connects the plurality of terminals 610 to a node DSB. The interconnection structure 611 electrically connects the electrodes 606 to the node DSB.

The electrodes 606 can be viewed as the source/drain electrodes of a MOSFET with FinFET structure. A fin structure 603, an EPI structure 604, a gate structure 605, and electrodes 606 form a transistor. Since the source/drain electrodes of the MOSFET are electrically connected, the transistor is viewed as a capacitor with one end being the gate electrode and the second end being the source/drain electrode.

As shown in FIG. 6, the stacked MOS varactor structure 6 with FinFET structure includes four columns of fin structures and two rows of gate structures. In some embodiments, the stacked MOS varactor structure 6 can include more or fewer columns of fin structures. In some embodiments, the stacked MOS varactor structure 6 can include more or fewer rows of gate structures. If the stacked MOS varactor structure with FinFET structure includes M columns of fin structures and N rows of gate structures, M×N MOSFETs can be implemented. In some embodiments, the number N is an integer equaling or exceeding three.

Figure 7:
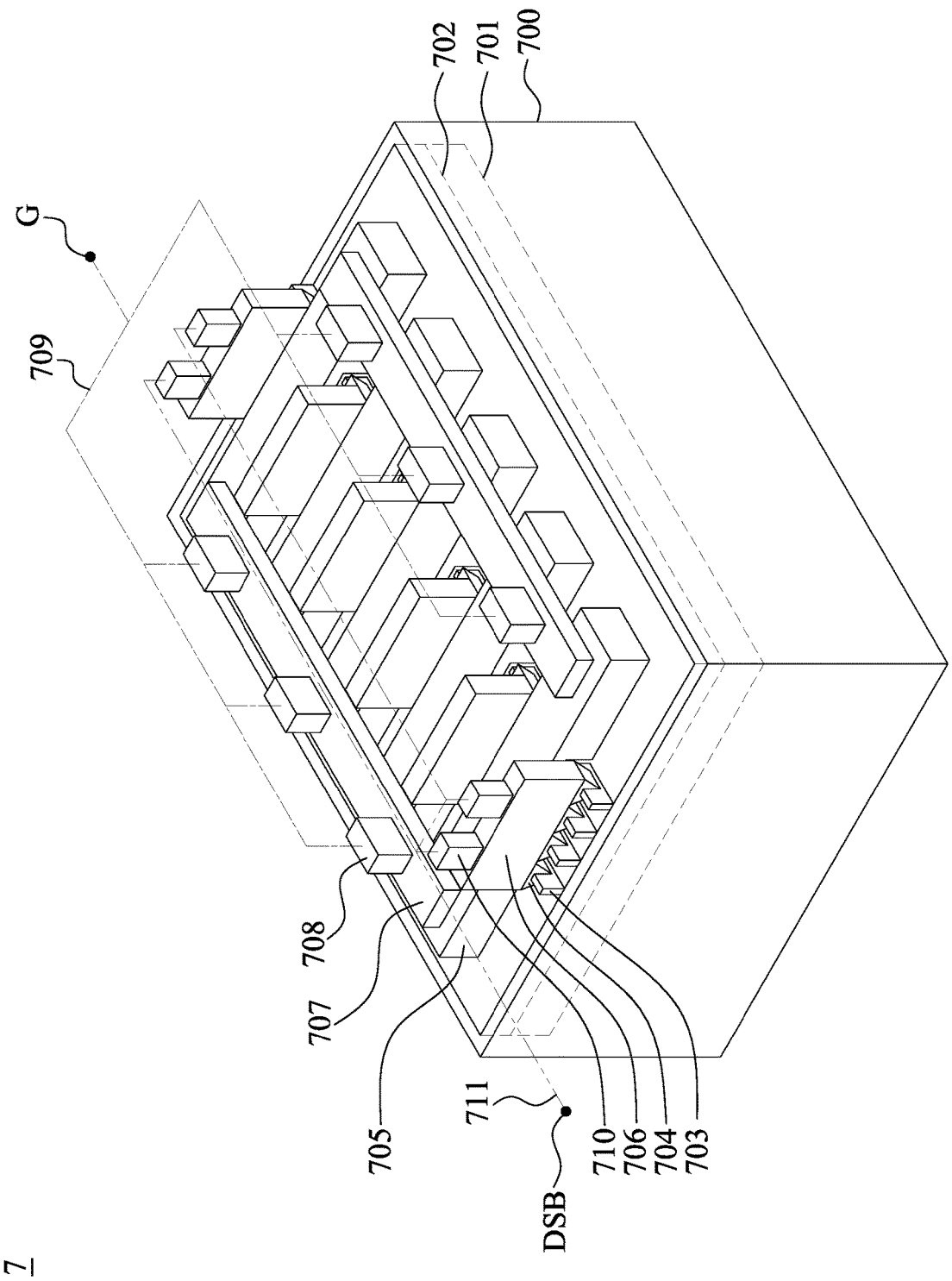
FIG. 7 illustrates an exemplary schematic view of a semiconductor device, in accordance with some embodiments of the present disclosure.

FIG. 7 illustrates an exemplary schematic view of a semiconductor device, in accordance with some embodiments of the present disclosure. The semiconductor device can be a stacked MOS varactor structure 7 in FinFET architecture. A substrate 700 of a conductivity type is provided. A deep well region 701 of the conductivity type is embedded in the substrate 700. A well region 702 of the conductivity type is embedded in the deep well region 701 and the substrate 700.

A plurality of fin structures 703 are disposed on the substrate 700 and the well region 702. The plurality of fin structures 703 are arranged along a first orientation. The plurality of fin structures 703 protrude from the well region 702. The fin structures 703 and the well region 702 are substantially equal in electrical potential. An EPI structure 704 is disposed on the substrate 700 and the plurality of fin structures 703. The EPI structure 704 surrounds each of the plurality of fin structures 703. Gate structures 705 are disposed on the fin structure 703. The gate structures 705 are arranged along the first orientation. Electrodes 706 are disposed on the EPI structure 704. The electrodes 706 are arranged along the first orientation. In some embodiments, the number of the electrodes 706 exceeds the number of the gate structures 705 by one. In some embodiments, the number of the gate structures 705 is an integer equaling or exceeding three.

Buffer structures 707 are disposed on the gate structures 705. The buffer structures 707 are arranged along a second orientation orthogonal to the first orientation. A plurality of terminals 708 are disposed on the buffer structures 707. The plurality of terminals 708 are electrically connected to the buffer structures 707 and the gate structures 705. In some embodiments, the number of the plurality of terminals 708 is different from the number of the gate structures 705.

An interconnection structure 709 electrically connects the plurality of terminals 708 to a node G. The interconnection structure 709 electrically connects the gate structures 705 to the node G through the plurality of terminals 708. A plurality of terminals 710 are disposed on the electrodes 706. The plurality of terminals 710 are electrically connected to the electrodes 706. An interconnection structure 711 electrically connects the plurality of terminals 710 to a node DSB. The interconnection structure 711 electrically connects the electrodes 706 to the node DSB.

The electrodes 706 can be viewed as the source/drain electrodes of a MOSFET with FinFET structure. A fin structure 703, an EPI structure 704, a gate structure 705, and electrodes 706 form a transistor. Since the source/drain electrodes of the MOSFET are electrically connected, the transistor is viewed as a capacitor with one end being the gate electrode and the second end being the source/drain electrode.

As shown in FIG. 7, the stacked MOS varactor structure 7 with FinFET structure includes four columns of fin structures and five rows of gate structures. In some embodiments, the stacked MOS varactor structure 7 can include more or fewer columns of fin structures. In some embodiments, the stacked MOS varactor structure 7 can include more or fewer rows of gate structures. If the stacked MOS varactor structure with FinFET structure includes M columns of fin structures and N rows of gate structures, M×N MOSFETs can be implemented.

Figure 8:
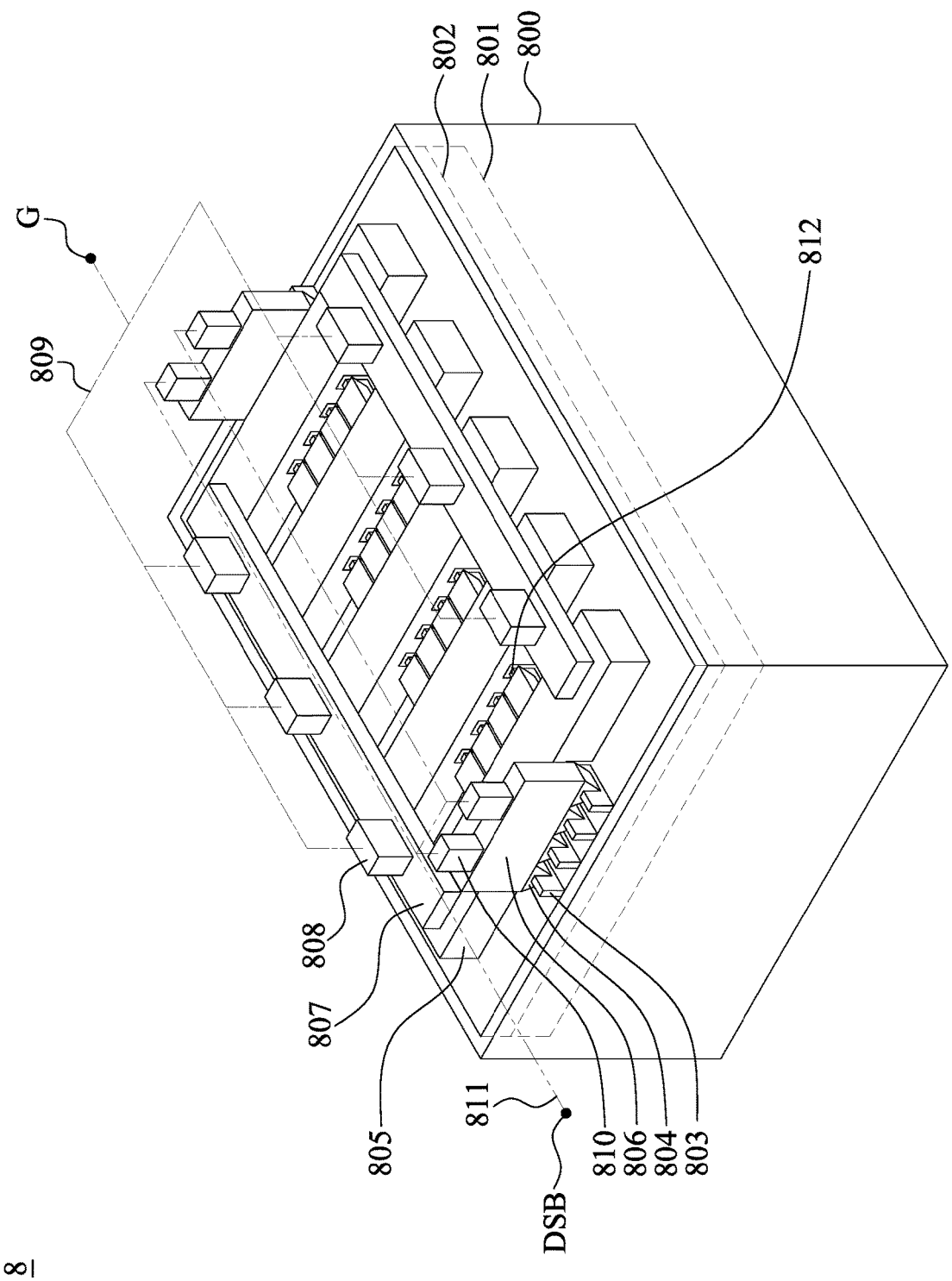
FIG. 8 illustrates an exemplary schematic view of a semiconductor device, in accordance with some embodiments of the present disclosure.

FIG. 8 illustrates an exemplary schematic view of a semiconductor device, in accordance with some embodiments of the present disclosure. The semiconductor device can be a stacked MOS varactor structure 8 in FinFET architecture. A substrate 800 of a conductivity type is provided. A deep well region 801 of the conductivity type is embedded in the substrate 800. A well region 802 of the conductivity type is embedded in the deep well region 801 and the substrate 800.

A plurality of fin structures 803 are disposed on the substrate 800 and the well region 802. The plurality of fin structures 803 are arranged along a first orientation. The plurality of fin structures 803 protrude from the well region 802. The fin structures 803 and the well region 802 are substantially equal in electrical potential. An EPI structure 804 is disposed on the substrate 800 and the plurality of fin structures 803. The EPI structure 804 surrounds each of the plurality of fin structures 803. Gate structures 805 are disposed on the fin structure 803. The gate structures 805 are arranged along the first orientation. Electrodes 806 are disposed on the EPI structure 804. The electrodes 806 are arranged along the first orientation. In some embodiments, the stacked MOS varactor structure 8 includes only two electrodes 806. The two electrodes 806 are the electrodes disposed on the uppermost and lowermost sides of the substrate 800.

Buffer structures 807 are disposed on the gate structures 805. The buffer structures 807 are arranged along a second orientation orthogonal to the first orientation. A plurality of terminals 808 are disposed on the buffer structures 807. The plurality of terminals 808 are electrically connected to the buffer structures 807 and the gate structures 805. In some embodiments, the number of the plurality of terminals 808 is different from the number of the gate structures 805.

An interconnection structure 809 electrically connects the plurality of terminals 808 to a node G. The interconnection structure 809 electrically connects the gate structures 805 to the node G through the plurality of terminals 808. A plurality of terminals 810 are disposed on the electrodes 806. The plurality of terminals 810 are electrically connected to the electrodes 806. An interconnection structure 811 electrically connects the plurality of terminals 810 to a node DSB. The interconnection structure 811 electrically connect the only two electrodes 806 to the node DSB.

The electrodes 806 can be viewed as the source/drain electrodes of a MOSFET with FinFET structure. A fin structure 803, an EPI structure 804, a gate structure 805, and electrodes 806 form a transistor. Since the source/drain electrodes of the MOSFET are electrically connected, the transistor is viewed as a capacitor with one end being the gate electrode and the second end being the source/drain electrode.

As shown in FIG. 8, the stacked MOS varactor structure 8 with FinFET structure includes four columns of fin structures and five rows of gate structures. In some embodiments, the stacked MOS varactor structure 8 can include more or fewer columns of fin structures. In some embodiments, the stacked MOS varactor structure 8 can include more or fewer rows of gate structures. If the stacked MOS varactor structure with FinFET structure includes M columns of fin structures and N rows of gate structures, M×N MOSFETs can be implemented.

Referring to FIG. 8, gate oxide 812 is disposed between the plurality of fin structures 803 and the gate structure 805. The gate structure 805 encapsulates the gate oxide 812.

Figure 9:
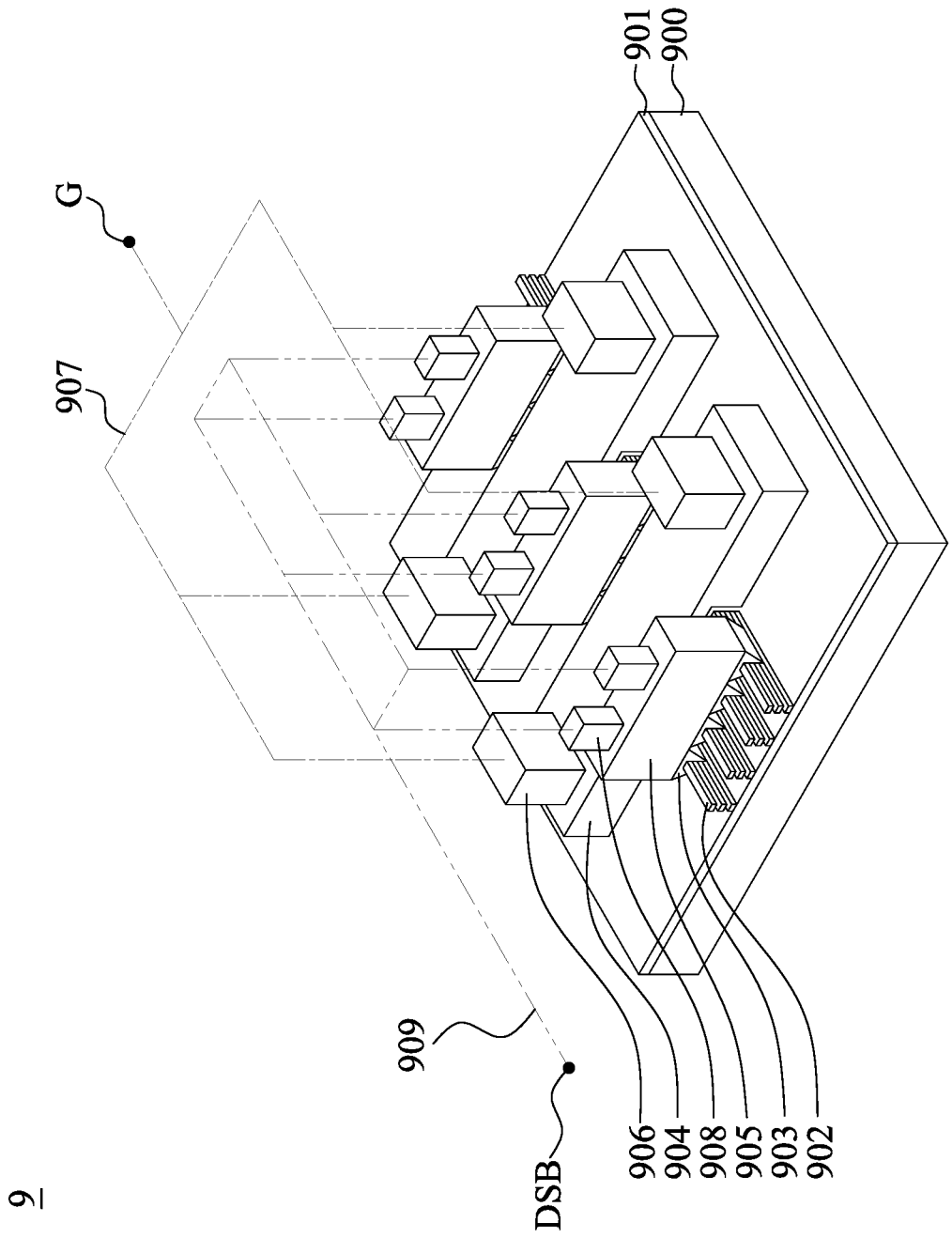
FIG. 9 illustrates an exemplary schematic view of a semiconductor device, in accordance with some embodiments of the present disclosure.

FIG. 9 illustrates an exemplary schematic view of a semiconductor device, in accordance with some embodiments of the present disclosure. The semiconductor device can be a stacked MOS varactor structure 9 with nanosheet structure. If each of the fin structures in FIG. 6 comprises multiple substructures, the fin structure is in the nanosheet architecture. A substrate 900 of a conductivity type is provided. A well region 901 of the conductivity type is embedded in the substrate 900.

A plurality of nanosheet structures 902 are disposed on the substrate 900 and the well region 901. The plurality of nanosheet structures 902 are arranged along a first orientation. The plurality of nanosheet structures 902 protrude from the well region 901. The plurality of nanosheet structures 902 and the well region 901 are substantially equal in electrical potential. An EPI structure 903 is disposed on the substrate 900 and the plurality of nanosheet structures 902. The EPI structure 903 surrounds each of the plurality of nanosheet structures 902. Gate structures 904 are disposed on the nanosheet structure 902. The gate structures 904 are arranged along the first orientation. Electrodes 905 are disposed on the EPI structure 903. The electrodes 905 are arranged along the first orientation. In some embodiments, the number of the electrodes 905 is greater than the number of the gate structures 904 by one.

A plurality of terminals 906 are disposed on the gate structure 904. The plurality of terminals 906 are electrically connected to the gate structures 904. In some embodiments, the number of the plurality of terminals 906 is the same as the number of the gate structures 904.

An interconnection structure 907 electrically connects the plurality of terminals 906 to a node G. The interconnection structure 907 electrically connects the gate structures 904 to the node G through the plurality of terminals 906. A plurality of terminals 908 are disposed on the electrodes 905. The plurality of terminals 908 are electrically connected to the electrodes 905. An interconnection structure 909 electrically connects the plurality of terminals 908 to a node DSB. The interconnection structure 909 electrically connects the electrodes 905 to the node DSB.

The electrodes 905 can be viewed as the source/drain electrodes of a MOSFET with nanosheet structure. A nanosheet structure 902, an EPI structure 903, a gate structure 904 and electrodes 905 form a transistor. Since the source/drain electrodes of the MOSFET are electrically connected, the transistor is viewed as a capacitor with one end being the gate electrode and the second end being the source/drain electrode.

As shown in FIG. 9, the stacked MOS varactor structure 9 with nanosheet structure includes four columns of nanosheet structures and two rows of gate structures. In some embodiments, the stacked MOS varactor structure 9 can include more or fewer columns of nanosheet structures. In some embodiments, the stacked MOS varactor structure 9 can include more or fewer rows of gate structures. If the stacked MOS varactor structure with nanosheet structure includes M columns of nanosheet structures and N rows of gate structures, M×N MOSFETs can be implemented.

Figure 10:
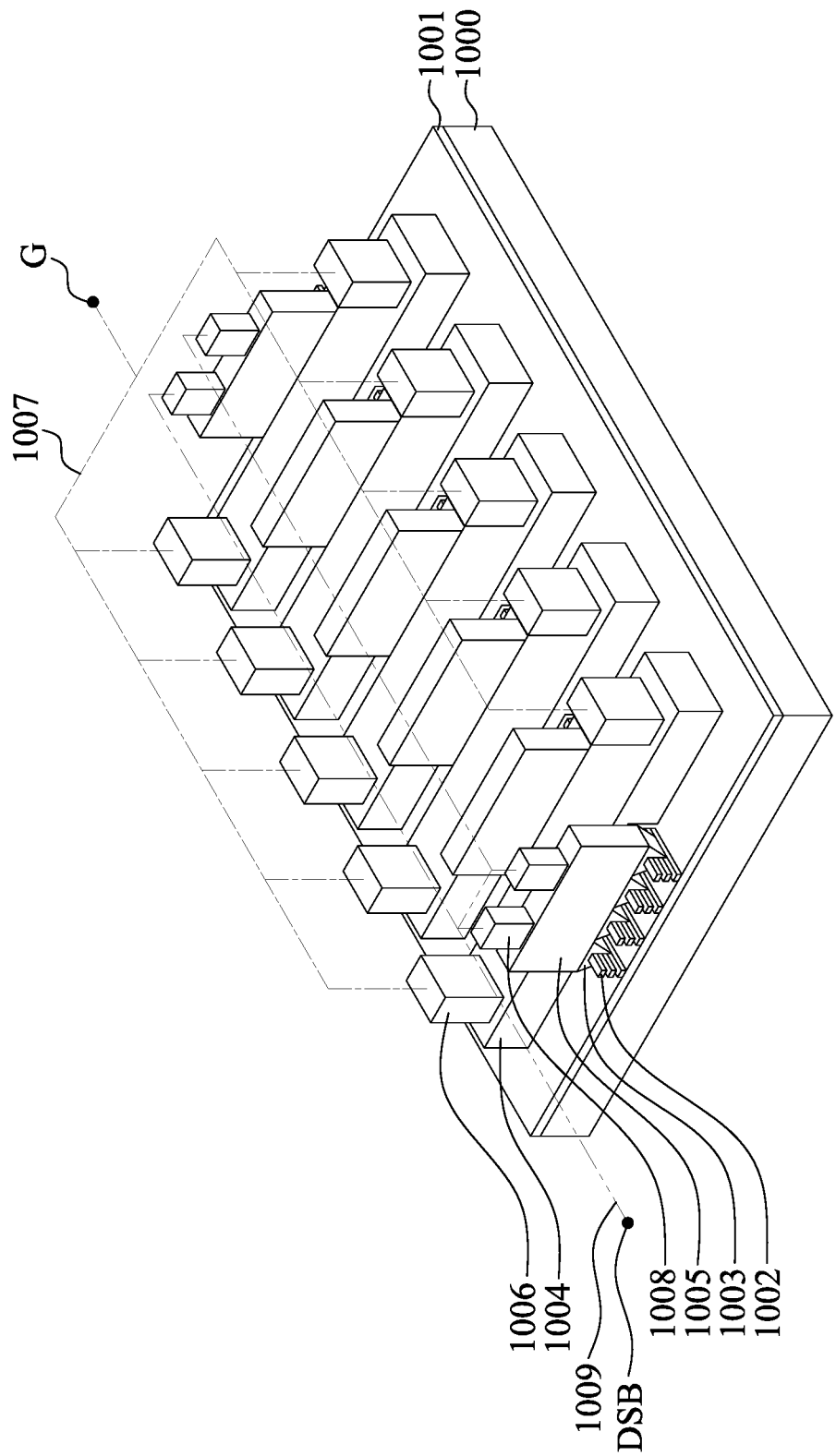
FIG. 10 illustrates an exemplary schematic view of a semiconductor device, in accordance with some embodiments of the present disclosure.

FIG. 10 illustrates an exemplary schematic view of a semiconductor device, in accordance with some embodiments of the present disclosure. The semiconductor device can be a stacked MOS varactor structure 10 with nanosheet structure. A substrate 1000 of a conductivity type is provided. A well region 1001 of the conductivity type is embedded in the substrate 1000.

A plurality of nanosheet structures 1002 are disposed on the substrate 1000 and the well region 1001. The plurality of nanosheet structures 1002 are arranged along a first orientation. The plurality of nanosheet structures 1002 protrude from the well region 1001. The plurality of nanosheet structures 1002 and the well region 1001 are substantially equal in electrical potential. An EPI structure 1003 is disposed on the substrate 1000 and the plurality of nanosheet structures 1002. The EPI structure 1003 surrounds each of the plurality of nanosheet structures 1002. Gate structures 1004 are disposed on the nanosheet structure 1002. The gate structures 1004 are arranged along the first orientation. Electrodes 1005 are disposed on the EPI structure 1003. The electrodes 1005 are arranged along the first orientation. In some embodiments, the number of the electrodes 1005 exceeds the number of the gate structures 1004 by one.

A plurality of terminals 1006 are disposed on the gate structure 1004. The plurality of terminals 1006 are electrically connected to the gate structures 1004. In some embodiments, the number of the plurality of terminals 1006 is the same as the number of the gate structures 1004.

An interconnection structure 1007 electrically connects the plurality of terminals 1006 to a node G. The interconnection structure 1007 electrically connect the gate structures 1004 to the node G through the plurality of terminals 1006. A plurality of terminals 1008 are disposed on the electrodes 1005. The plurality of terminals 1008 are electrically connected to the electrodes 1005. An interconnection structure 1009 electrically connects the plurality of terminals 1008 to a node DSB. The interconnection structure 1009 electrically connect the electrodes 1005 to the node DSB.

The electrodes 1005 can be viewed as the source/drain electrodes of a MOSFET with nanosheet structure. A nanosheet structure 1002, an EPI structure 1003, a gate structure 1004, and electrodes 1005 form a transistor. Since the source/drain electrodes of the MOSFET are electrically connected, the transistor is viewed as a capacitor with one end being the gate electrode and the second end being the source/drain electrode.

As shown in FIG. 10, the stacked MOS varactor structure 10 with nanosheet structure includes four columns of nanosheet structures and five rows of gate structures. In some embodiments, the stacked MOS varactor structure 10 can include more or fewer columns of nanosheet structures. In some embodiments, the stacked MOS varactor structure 10 can include more or fewer rows of gate structures. If the stacked MOS varactor structure with nanosheet structure includes M columns of nanosheet structures and N rows of gate structures, M×N MOSFETs can be implemented.

Figure 11:
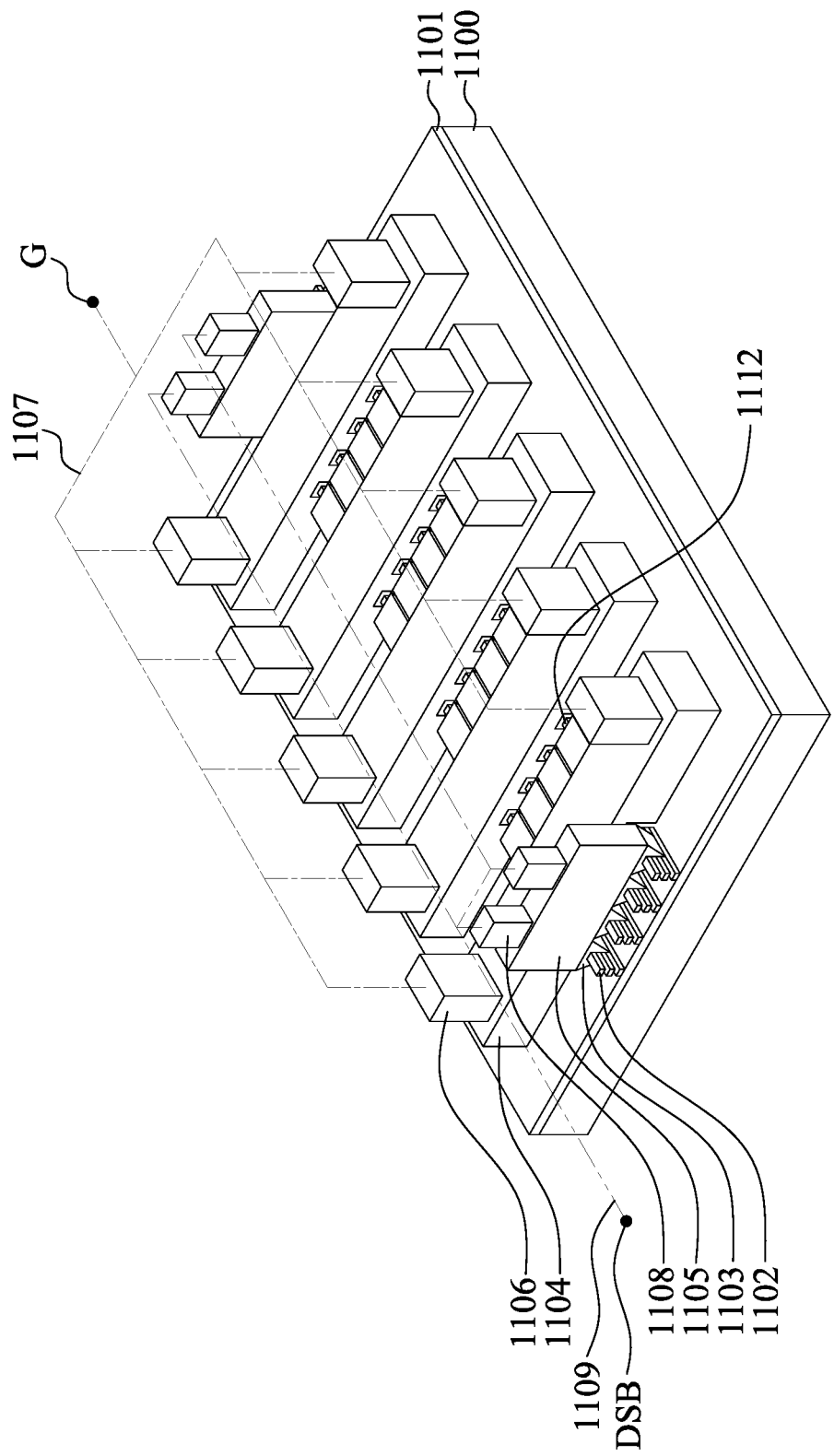
FIG. 11 illustrates an exemplary schematic view of a semiconductor device, in accordance with some embodiments of the present disclosure.

FIG. 11 illustrates an exemplary schematic view of a semiconductor device, in accordance with some embodiments of the present disclosure. The semiconductor device can be a stacked MOS varactor structure 11 with nanosheet structure. A substrate 1100 of a conductivity type is provided. A well region 1101 of the conductivity type is embedded in the substrate 1100.

A plurality of nanosheet structures 1102 are disposed on the substrate 1100 and the well region 1101. The plurality of nanosheet structures 1102 are arranged along a first orientation. The plurality of nanosheet structures 1102 protrude from the well region 1101. The plurality of nanosheet structures 1102 and the well region 1101 are substantially equal in electrical potential. An EPI structure 1103 is disposed on the substrate 1100 and the plurality of nanosheet structures 1102. The EPI structure 1103 surrounds each of the plurality of nanosheet structures 1102. Gate structures 1104 are disposed on the nanosheet structures 1102. The gate structures 1104 are arranged along the first orientation. Electrodes 1105 are disposed on the nanosheet structure 1102 and the EPI structure 1103. The electrodes 1105 are arranged along the first orientation. In some embodiments, the stacked MOS varactor structure 11 includes only two electrodes 1105 which are disposed on the uppermost and lowermost sides of the substrate 1100.

A plurality of terminals 1106 are disposed on the plurality of gate structures 1004. The plurality of terminals 1106 are electrically connected to the gate structures 1104. In some embodiments, the number of the plurality of terminals 1106 is the same as the number of the gate structures 1104.

An interconnection structure 1107 electrically connects the plurality of terminals 1106 to a node G. The interconnection structure 1107 electrically connects the gate structures 1104 to the node G through the plurality of terminals 1106. A plurality of terminals 1108 are disposed on the electrodes 1105. The plurality of terminals 1108 are electrically connected to the electrodes 1105. An interconnection structure 1109 electrically connects the plurality of terminals 1108 to a node DSB. In FIG. 11, the interconnection structure 1109 electrically connects only two electrodes 1105 to the node DSB.

The electrodes 1105 can be viewed as the source/drain electrodes of a MOSFET with nanosheet structure. A nanosheet structure 1102, an EPI structure 1103, a gate structure 1104 and electrodes 1105 form a transistor. Since the source/drain electrodes of the MOSFET are electrically connected, the transistor is viewed as a capacitor with one end being the gate electrode and the second end being the source/drain electrode.

As shown in FIG. 11, the stacked MOS varactor structure 11 with nanosheet structure includes four columns of nanosheet structures and five rows of gate structures. In some embodiments, the stacked MOS varactor structure 11 can include more or fewer columns of nanosheet structures. In some embodiments, the stacked MOS varactor structure 11 can include more or fewer rows of gate structures. If the stacked MOS varactor structure with nanosheet structure includes M columns of nanosheet structures and N rows of gate structures, M×N MOSFETs can be implemented.

Referring to FIG. 11, gate oxide 1112 is disposed between the plurality of nanosheet structures 1102 and the gate structure 1104. The gate structure 1104 encapsulates the gate oxide 1112.

Figure 12:
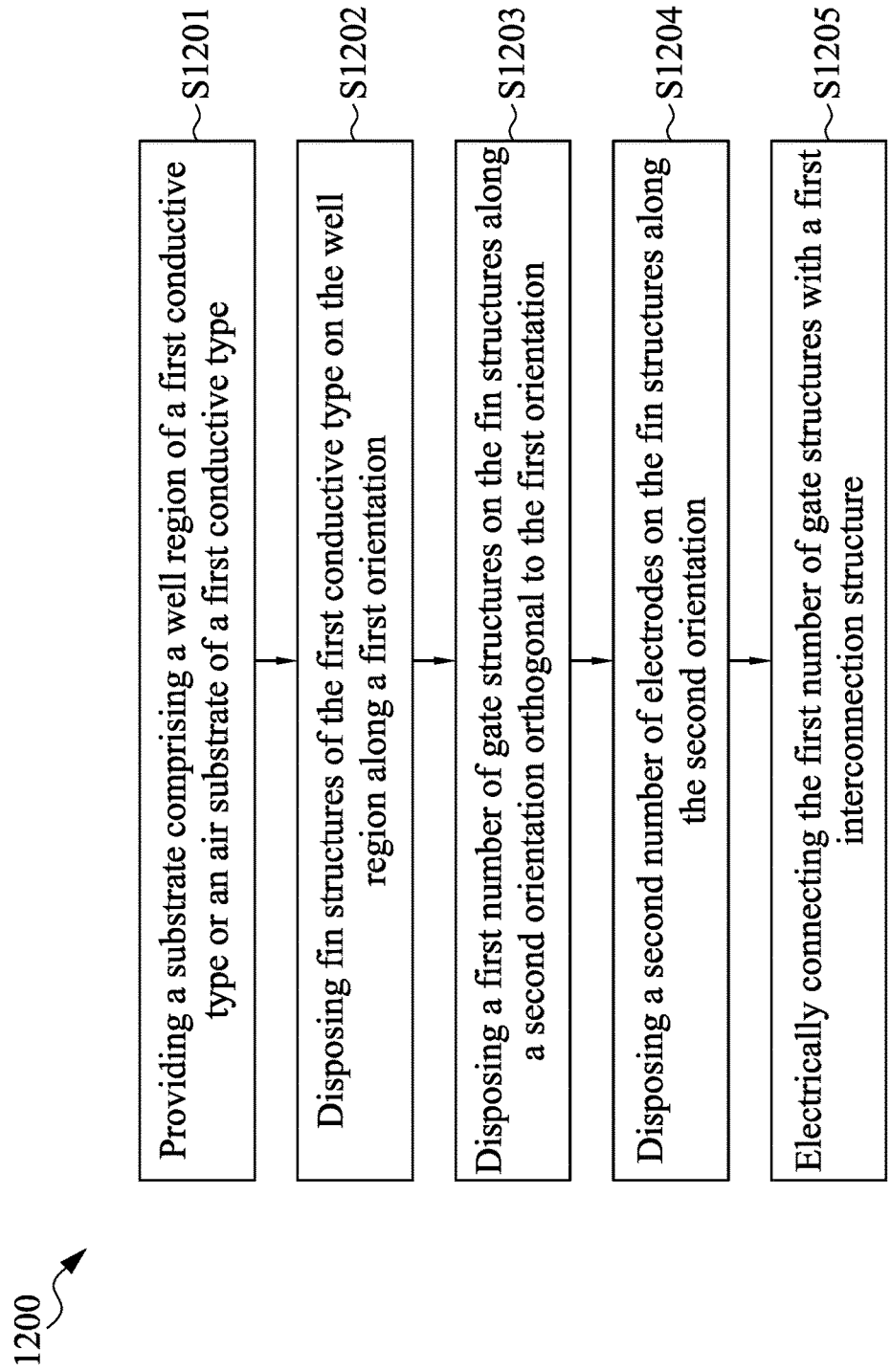
FIG. 12 is a flowchart illustrating a method for manufacturing a semiconductor device, in accordance with various aspects of the present disclosure.

FIG. 12 is a flowchart illustrating a method for manufacturing a semiconductor device, in accordance with various aspects of the present disclosure.

The method 1200 includes operation S1201. In operation S1201, a substrate comprising a well region of the first conductive type is provided. For example, the substrate 600 comprising a well region 602 of the first conductive type as shown in FIG. 6, is provided. In operation S1201, an air substrate of a first conductive type in nanosheet technology may be provided.

The method 1200 includes operation S1202. In operation S1202, fin structures of the first conductive type are disposed on the well region along a first orientation. For example, fin structures 603 of the first conductive type are disposed on the well region 602 along a first orientation, as shown in FIG. 6.

The method 1200 includes operation S1203. In operation S1203, a first number of gate structures are disposed on the fin structures along a second orientation orthogonal to the first orientation. For example, a first number of gate structures 605 are disposed on the fin structures 603 along a second orientation orthogonal to the first orientation, as shown in FIG. 6.

The method 1200 includes operation S1204. In operation S1204, a second number of electrodes are disposed on the fin structures along the second orientation. For example, a second number of electrodes 606 are disposed on the fin structures 603 along the second orientation, as shown in FIG. 6.

The method 1200 includes operation S1205. In operation S1205, the first number of gate structures and a first interconnection structure are electrically connected. For example, the first number of gate structures 605 and a first interconnection structure 609 are electrically connected, as shown in FIG. 6.

In some embodiments, the second number of electrodes are electrically connected with a second interconnection structure. For example, the second number of electrodes 606 are electrically connected with a second interconnection structure 611, as shown in FIG. 6. In some embodiments, only two of the second number of electrodes are electrically connected with a second interconnection structure. For example, only two of the second number of electrodes 806 are electrically connected with a second interconnection structure 809, as shown in FIG. 8.

The method 1200 is merely an example, and is not intended to limit the present disclosure beyond what is explicitly recited in the claims. Additional operations can be provided before, during, or after each operation of the method 1200, and some operations described can be replaced, eliminated, or reordered for additional embodiments of the method. In some embodiments, the method 1200 can include further operations not depicted in FIG. 12.

Some embodiments of the present disclosure provide a semiconductor device. The semiconductor device comprises a substrate, a first gate electrode, a second gate electrode, a first doped region, a second doped region, a third doped region, and a first interconnection structure. The substrate comprises a well region of a first conductive type. The first gate electrode is disposed on the substrate. The second gate electrode is disposed on the substrate. The first doped region is embedded within the well region and is of the first conductive type. The second doped region is embedded within the well region and is of the first conductive type. The third doped region is embedded within the well region and is of the first conductive type. The first interconnection structure electrically connects the first gate electrode and the second gate electrode. The first doped region and the second doped region are disposed on opposite sides of the first gate electrode.

Some embodiments of the present disclosure provide a semiconductor device. The semiconductor device comprises a substrate, fin structures, a first number of gate structures, a second number of gate structures, and a first interconnection structure. The substrate comprises a well region of a first conductive type. The fin structures of the first conductive type are disposed on the well region along a first orientation. The first number of gate structures are disposed on the fin structures along a second orientation orthogonal to the first orientation. The second number of electrodes are disposed on the fin structures along the second orientation. The first interconnection structure electrically connects the first number of gate structures.

Some embodiments of the present disclosure provide a method of manufacturing a semiconductor device. The method comprises providing a substrate comprising a well region of a first conductive type, disposing fin structures of the first conductive type on the well region along a first orientation, disposing a first number of gate structures on the fin structures along a second orientation orthogonal to the first orientation, disposing a second number of electrodes on the fin structures along the second orientation, and electrically connecting the first number of gate structures with a first interconnection structure.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate including a well region of a first conductive type;
fin structures of the first conductive type, the fin structures being on the well region and extending in a first direction;
gate structures on the fin structures, the gate structures extending in a second direction orthogonal to the first direction and including at least a first gate structure, a second gate structure, and a third gate structure;
source/drain (S/D) electrodes on the fin structures, the S/D electrodes extending in the second direction and including at least a first S/D electrode, a second S/D electrode, a third S/D electrode, and a fourth S/D electrode, wherein:
the first through third gate structures and the first through fourth S/D electrodes are arranged in the following sequence in the first direction:
the first S/D electrode, the first gate structure, the second S/D electrode, the second gate structure, the third S/D electrode, the third gate structure, and the fourth S/D electrode,
the first gate structure is immediately adjacent to the first and second S/D electrodes, and
the second gate structure is immediately adjacent to the second and third S/D electrodes;
a first interconnection structure electrically connecting all of the first, second, and third gate structures; and
a second interconnection structure electrically connecting the first and fourth S/D electrodes, and being free of a connection to the second and third S/D electrodes.

2. The semiconductor device of claim 1, wherein:
the first interconnection structure electrically connects to every gate structure between the first and fourth S/D electrodes.

3. The semiconductor device of claim 1, wherein the fin structures and the well region are substantially equal in electrical potential.

4. The semiconductor device of claim 1, wherein:
the first S/D electrode, the second S/D electrode, the third S/D electrode, and the fourth S/D electrode overlap the well region.

5. The semiconductor device of claim 1, further comprising:
a deep well region, the well region having a same conductive type as the deep well region and being embedded in the deep well region.

6. The semiconductor device of claim 1, wherein:
the first S/D electrode, the first gate structure, and the second S/D electrode are included in a first transistor, and
the second S/D electrode, the second gate structure, and the third S/D electrode are included in a second transistor.

7. A semiconductor device, comprising:
a substrate including a first well region of a first conductive type and a second well region of the first conductive type, the first well region being in the second well region;
fin structures of the first conductive type on the first well region and extending in a first direction;
a first gate structure, a second gate structure, and a third gate structure on the substrate on the first well region, the first through third gate structures extending in a second direction different from the first direction and crossing the fin structures;

a first source/drain (S/D) electrode, a second S/D electrode, a third S/D electrode, and a fourth S/D electrode on the substrate on the first well region, wherein:
the first through third gate structures and the first through fourth S/D electrodes are arranged in the following sequence in the first direction:
the first S/D electrode, the first gate structure, the second S/D electrode, the second gate structure, the third S/D electrode, the third gate structure, and the fourth S/D electrode,
the first gate structure is immediately adjacent to the first and second S/D electrodes, and
the second gate structure is immediately adjacent to the second and third S/D electrodes;
a first interconnection structure electrically connecting all of the first, second, and third gate structures; and
a second interconnection structure electrically connecting the first and fourth S/D electrodes, the second interconnection structure being free of an electrical connection to the second and third S/D electrodes.

8. The semiconductor device of claim 7, wherein the fin structures and the first well region are substantially equal in electrical potential.

9. The semiconductor device of claim 7, wherein:
the first S/D electrode, the first gate structure, and the second S/D electrode are included in a first transistor structure, and
the second S/D electrode, the second gate structure, and the third S/D electrode are included in a second transistor structure.

10. The semiconductor device of claim 7, wherein the first S/D electrode, the third S/D electrode, and the first well region are electrically connected.

11. The semiconductor device of claim 7, wherein the fin structures are free of epitaxy structures between the fin structures and the first and second gate structures.

12. The semiconductor device of claim 7, wherein the first conductive type is N-type.

13. The semiconductor device of claim 7, further comprising:
a deep well region, the first well region having a same conductive type as the deep well region and being embedded in the deep well region.

14. The semiconductor device of claim 7, wherein:
the first S/D electrode, the second S/D electrode, the third S/D electrode, and the fourth S/D electrode overlap the first well region.

15. A semiconductor device, comprising:
fin structures extending in a first direction;
a first gate structure, a second gate structure, and a third gate structure extending in second direction different from the first direction and crossing the fin structures;
a first source/drain (S/D) electrode, a second S/D electrode, a third S/D electrode, and a fourth S/D electrode on the fin structures, wherein:
the first through third gate structures and the first through fourth S/D electrodes are arranged in the following sequence in the first direction:
the first S/D electrode, the first gate structure, the second S/D electrode, the second gate structure, the third S/D electrode, the third gate structure, and the fourth S/D electrode,
the first gate structure is immediately adjacent to the first and second S/D electrodes, and
the second gate structure is immediately adjacent to the second and third S/D electrodes,
a first interconnection structure electrically connecting all of the first, second, and third gate structures; and
a second interconnection structure electrically connecting the first and fourth S/D electrodes, the second interconnection structure being free of an electrical connection to the second and third S/D electrodes.

16. The semiconductor device of claim 15, wherein:
the first S/D electrode, the first gate structure, and the second S/D electrode are included in a first transistor, and
the second S/D electrode, the second gate structure, and the third S/D electrode are included in a second transistor.

17. The semiconductor device of claim 15, further comprising:
a well region under the fin structures,
wherein the fin structures and the well region are substantially equal in electrical potential.

18. The semiconductor device of claim 17, wherein:
the first S/D electrode, the second S/D electrode, the third S/D electrode, and the fourth S/D electrode overlap the well region.

19. The semiconductor device of claim 17, further comprising:
a deep well region, the well region having a same conductive type as the deep well region and being embedded in the deep well region.

20. The semiconductor device of claim 17, wherein the first S/D electrode, the third S/D electrode, and the well region are electrically connected.

* * * * *